(12) United States Patent
Willey

(10) Patent No.: US 8,729,941 B2
(45) Date of Patent: May 20, 2014

(54) DIFFERENTIAL AMPLIFIERS, CLOCK GENERATOR CIRCUITS, DELAY LINES AND METHODS

(75) Inventor: Aaron Willey, Burlington, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/899,444

(22) Filed: Oct. 6, 2010

(65) Prior Publication Data

US 2012/0086488 A1 Apr. 12, 2012

(51) Int. Cl.
*H03L 7/00* (2006.01)
(52) U.S. Cl.
USPC ............ 327/161; 327/153; 327/141; 375/376
(58) Field of Classification Search
USPC ................. 327/141, 144–163; 331/15–17; 375/373–376
See application file for complete search history.

(56) References Cited

U.S. PATENT DOCUMENTS

| | | | |
|---|---|---|---|
| 5,614,855 A | 3/1997 | Lee et al. | |
| 6,225,863 B1 * | 5/2001 | Miwa | 330/9 |
| 6,445,228 B1 | 9/2002 | Nguyen | |
| 7,046,052 B1 | 5/2006 | Percey et al. | |
| 7,148,726 B2 * | 12/2006 | Oka et al. | 326/86 |
| 7,183,824 B2 * | 2/2007 | Park et al. | 327/172 |
| 7,288,967 B2 * | 10/2007 | Byun et al. | 326/83 |
| 7,528,668 B2 * | 5/2009 | Kim et al. | 331/45 |
| 7,557,602 B2 * | 7/2009 | Kim et al. | 326/26 |
| 7,598,783 B2 | 10/2009 | Shin et al. | |
| 7,622,969 B2 | 11/2009 | Johnson | |
| 7,821,310 B2 | 10/2010 | Yun et al. | |
| 7,830,187 B2 * | 11/2010 | Chung et al. | 327/158 |
| 7,956,659 B2 * | 6/2011 | You et al. | 327/161 |
| 7,990,194 B2 | 8/2011 | Shim | |
| 2003/0117194 A1 * | 6/2003 | Lee | 327/158 |
| 2004/0046596 A1 * | 3/2004 | Kaeriyama et al. | 327/165 |
| 2005/0127966 A1 * | 6/2005 | Lee | 327/158 |
| 2005/0151565 A1 * | 7/2005 | Oka et al. | 326/86 |
| 2006/0214689 A1 * | 9/2006 | Byun et al. | 326/83 |
| 2007/0109058 A1 * | 5/2007 | Kim et al. | 331/45 |
| 2007/0229164 A1 * | 10/2007 | Lin et al. | 330/285 |
| 2008/0100355 A1 | 5/2008 | Omote | |
| 2010/0052745 A1 * | 3/2010 | Chung et al. | 327/149 |
| 2010/0117735 A1 * | 5/2010 | Oelmaier | 330/253 |
| 2011/0018600 A1 | 1/2011 | Chung et al. | |
| 2011/0234278 A1 | 9/2011 | Seo | |
| 2011/0248752 A1 | 10/2011 | Willey et al. | |
| 2012/0268171 A1 | 10/2012 | Willey | |

* cited by examiner

*Primary Examiner* — Brandon S Cole
(74) *Attorney, Agent, or Firm* — Dorsey & Whitney LLP

(57) ABSTRACT

A differential amplifier may be configured to have a duty cycle and/or gain that is adjustable, such as by adjusting the switch points of circuitry in the differential amplifier. The differential amplifier may alternatively or additionally have a hysteresis function by, for example, using a signal feedback from the output of the amplifier to adjust the switch points of circuitry in the differential amplifier. The differential amplifier may be used for a variety of purposes, such as in an input buffer or delay line, either of which may be used, for example, in a clock generator circuit.

9 Claims, 6 Drawing Sheets

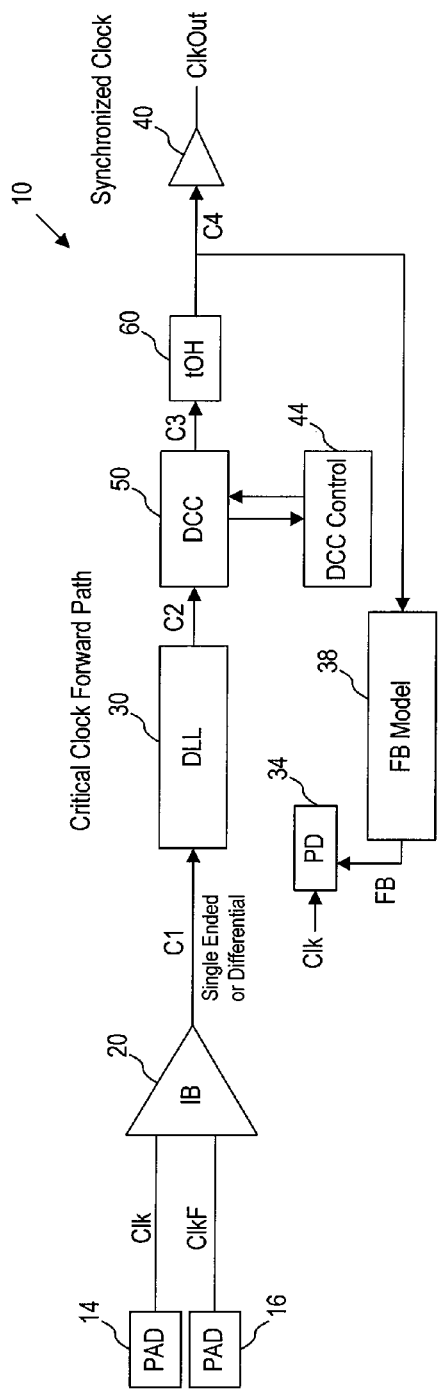
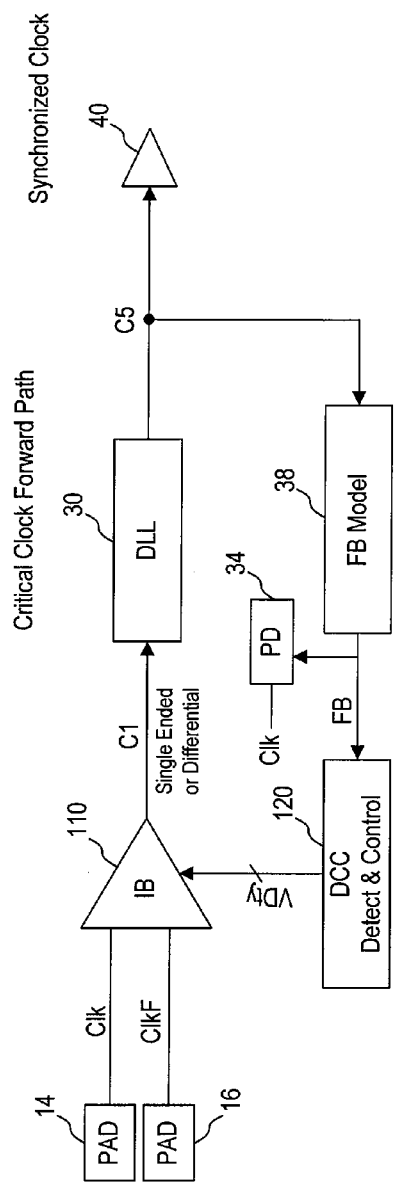
Figure 1 (prior art)
Figure 2

Amplifier with DCC Function

Amplifier with DCC Function

DIFFERENTIAL AMPLIFIERS, CLOCK GENERATOR CIRCUITS, DELAY LINES AND METHODS

TECHNICAL FIELD

Embodiments of this invention relate generally to clock signal generators, and more specifically, to clock signal generators in which the duty cycle of a generated clock signal may be corrected.

BACKGROUND OF THE INVENTION

Clock signals may be used in electronic circuits for timing the operation of various internal circuits. For example, in synchronous memory devices, external clock signals may be provided to a memory device and internally distributed to various circuits so that internal operations in the memory device can be synchronized to the operation of external devices. Examples of such synchronous integrated circuits include synchronous memory devices such as synchronous dynamic random access memories ("SDRAMs"), synchronous static random access memories ("SSRAMs"), and packetized memories like SLDRAMs and RDRAMs, and include other types of integrated circuits as well, such as microprocessors.

A number of different approaches have been used to synchronize internal clock signals to external clock signals, including the use of delay-locked loops ("DLLs"). Although a single clock edge transition, such as the rising edge of clock signals, may be used to control the timing of internal operations, both the rising edges and the falling edges of clock signals may also be used for this purpose. However, as the frequency of clock signals increase, variations in the duty cycle of clock signals may introduce unacceptable timing errors. Clock signals may ideally have a duty cycle of 50% so that the timing of internal operations synchronized to both the rising and falling edges of the clocks signals are equally spaced in time from each other. However, in some applications a duty cycle of other than 50% may be desired. Variations in the duty cycle from a specific value may introduce timing errors because operations that are synchronized to the falling edges of the clock signals may occur too early or too late relative to the occurrence of operations that are synchronized to the rising edge of the clock signals. For example, if the rising edges of a clock signal are used to output odd bits of read data from a memory device and the falling edges of the clock signal are used to output intervening even bits of read data, variations in the duty cycle may vary the period of time that valid read data bits are output from the memory device. Yet the duration of the period that valid read data must be provided, a parameter known as the "output hold time" and abbreviated "tOH," may have a specified minimum value. Variations in the duty cycle of a clock signal used in this manner may therefore cause the memory device to fail to meet required performance specifications.

Duty cycle correction circuits have been developed to correct duty cycle variations to a 50% or some other specific duty cycle. Prior art dynamic duty cycle or tOH correction circuits may correct the duty cycle by delaying a clock signal and adjusting the magnitude of the delay. This delay may be provided by coupling the clock signal through a large number of series-coupled logic gates or inverters, and the delay may be adjusted by varying the number of gates or inverters through which the clock signal is coupled. Unfortunately, coupling clock signals, particularly high frequency clock signals, through a large number of gates or inverters may consume substantial power because power may be consumed as each of many gates or inverters switches responsive to each transition of the clock signal. Therefore, prior art duty cycle correction circuits used in clock generators and other circuits may consume excessive power.

BRIEF DESCRIPTION OF THE DRAWINGS

FIG. 1 is a block diagram of a prior art clock generator circuit.

FIG. 2 is a block diagram of an embodiment of a clock generator circuit.

DETAILED DESCRIPTION

Figure 3:
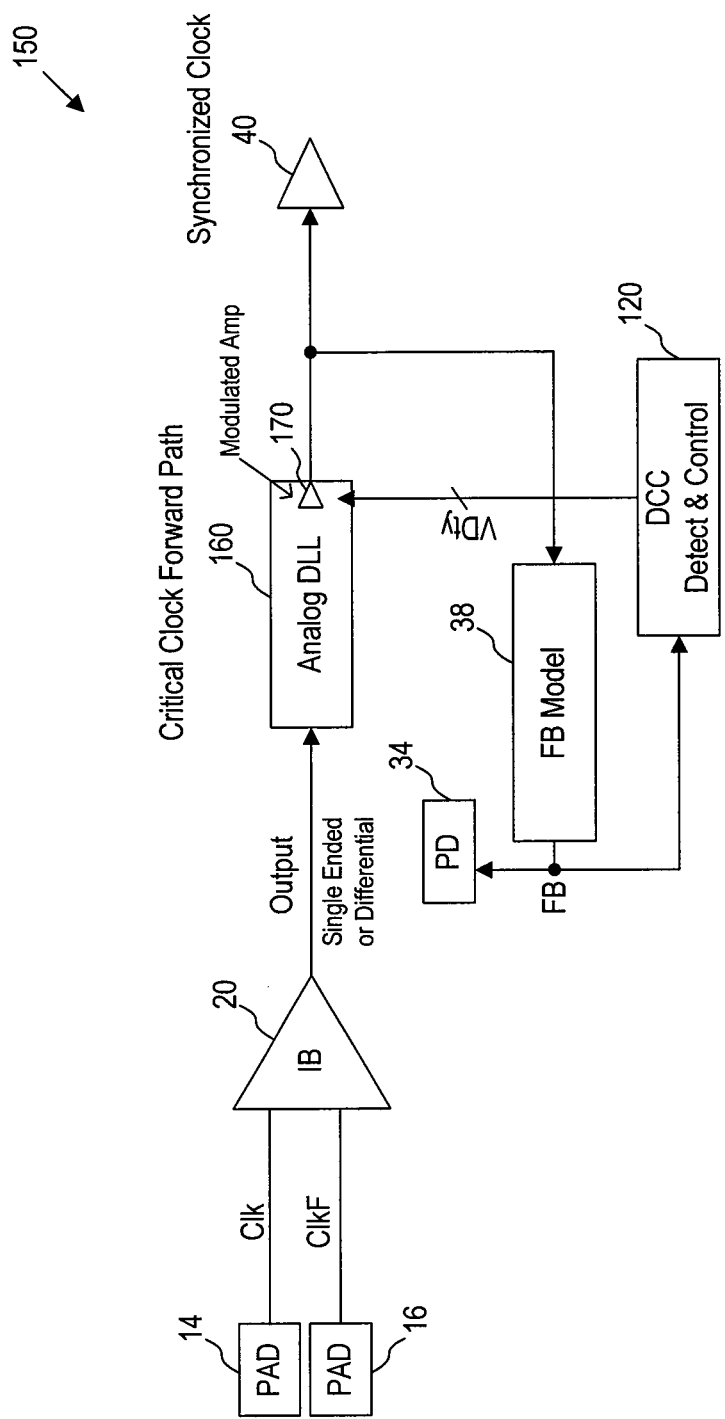
FIG. 3 is a block diagram of another embodiment of a clock generator circuit.

FIG. 1 illustrates an embodiment of a prior art clock generator circuit 10 having a first node 14 receiving an external clock signal Clk and a second clock node 16 receiving a complementary external clock signal ClkF. These clock signals may be provided to respective inputs of a differential input buffer 20, which may output a single clock signal C1. The clock signal C1 output from the buffer 20 may have a rising edge synchronized to the rising edge of the clock signal Clk and a falling edge synchronized to the rising edge of the complementary clock signal ClkF.

The clock signal C1 may be applied to the input of a delay-locked loop (DLL) 30, which delays the clock signal C1 to generate a delay clock signal C2. The magnitude of the delay provided by the DLL 30 may be controlled by a phase detector 34, which receives a feedback clock signal FB from a model delay circuit 38. As is well known in the art, the model delay circuit 38 may compensate for delays in the input buffer 20 and in an output buffer 40. The phase detector 34 may compare the phase of the feedback clock signal FB with the phase of the external clock signal Clk. The phase detector 34 may then control the delay provided by the DLL 30 so that the feedback clock signal FB may be in phase with the external clock signal Clk.

The delayed clock signal C2 may be provided to a duty cycle correction ("DCC") circuit 50, which may be controlled by a DCC control circuit 44. As explained above, the DCC may include a substantial number of logic gates through which the delayed clock signal C2 may propagate, and it may adjust the number of gates through which the delayed clock signal C2 propagates to ensure that the duty cycle of a corrected clock signal C3 is substantially 50% or some other specific value of duty cycle. Insofar at the DCC may be continuously adjusted, it may correct dynamic duty cycle errors, which are duty cycle errors that may change as a result of, for example, changes in the temperature or supply voltage of the clock generator circuit 10.

The duty cycle of a corrected clock signal C3 may be provided to a static trim circuit 60, which may correct duty cycle errors that do not change with time but may result from, for example, process variations. The correction provided by the static trim circuit 60 may be adjusted during manufacture by, for example, opening fusible links or programming antifuses or the like. The static trim circuit 60 may then output a corrected clock signal C4 to the output buffer 40, which outputs a synchronized clock signal ClkOut.

As mentioned above, the large number of logic gates commonly used in the DCC 50 and/or the static trim circuit 60 may cause the clock generator circuit 10 to consume a substantial amount of power. An embodiment of a clock generator circuit 100 shown in FIG. 2 may consume substantially less power than prior art clock generator circuits. The clock generator circuit 100 may include many of the same components that are in the clock generator circuit 10 of FIG. 1. Therefore, in the interest of brevity and clarity, the same reference numerals will be used, and an explanation of their structure and operation will not be repeated. The clock generator circuit 100 differs from the clock generator circuit 10 by including a differential amplifier used as an input buffer 110 that may be controlled by a DCC Detect & Control circuit 120 to adjust the duty cycle of the clock signal C1. As a result, a clock signal C5 applied to the output buffer 40 may have substantially no duty cycle error, i.e., the duty cycle may be substantially 50%, or it may have some other specific duty cycle. Therefore, the clock generator circuit 100 may dispense with the DCC 50 and the static delay circuit 60 used in the prior art clock generator circuit 10. Therefore, the clock generator circuit 100 does not consume the substantial power consumed by switching a large number of logic gate generally used in prior art DCCs 50 and static delay circuits 60.

The DCC Detect & Control circuit 120 is able to generate a control signal VDty for the input buffer 110 by processing a feedback clock signal FB from the model delay circuit 38. The control signal VDty may then adjust the duty cycle of the a feedback clock signal FB so that it has a substantially 50% or some other duty cycle. In making this adjustment, the DCC Detect & Control circuit 120 and input buffer 110 may compensate for any duty cycle skews generated in the DLL 30 since the duty cycle of the clock signal C1 applied to the DLL 30 may be adjusted to whatever duty cycle makes the duty cycle of the feedback clock signal FB substantially 50% or some other specific duty cycle value.

Another embodiment of a clock generator circuit 150 is shown in FIG. 3. Again, the clock generator circuit 150 may include many of the same components that are in the clock generator circuit 100 of FIG. 2, so that the same reference numerals will be used for those components, and a detailed explanation of them will not be repeated. Rather than using a DCC adjusting differential amplifier in the input buffer 110 as in the embodiment of FIG. 2, the clock generator circuit 150 uses a DCC adjusting differential amplifier in another portion of the clock forward clock path (i.e., the path from the input nodes 14, 16 to the output of the buffer 40). Specifically, the clock generator circuit 150 may use an analog delay line 160 that includes a DCC adjusting differential amplifier 170 in one of its delay stages. In the embodiment of FIG. 3, the DCC adjusting differential amplifier 170 may be used in the last delay stage. However, in other embodiments, the DCC adjusting differential amplifier 170 may be used in other stages. Also, in the embodiment of FIG. 3, a single DCC adjusting differential amplifier 170 may be used. In other embodiments, two or more DCC adjusting differential amplifiers may be used, and they may be controlled from the same of different DCC Detect & Control circuits 120.

Figure 4:
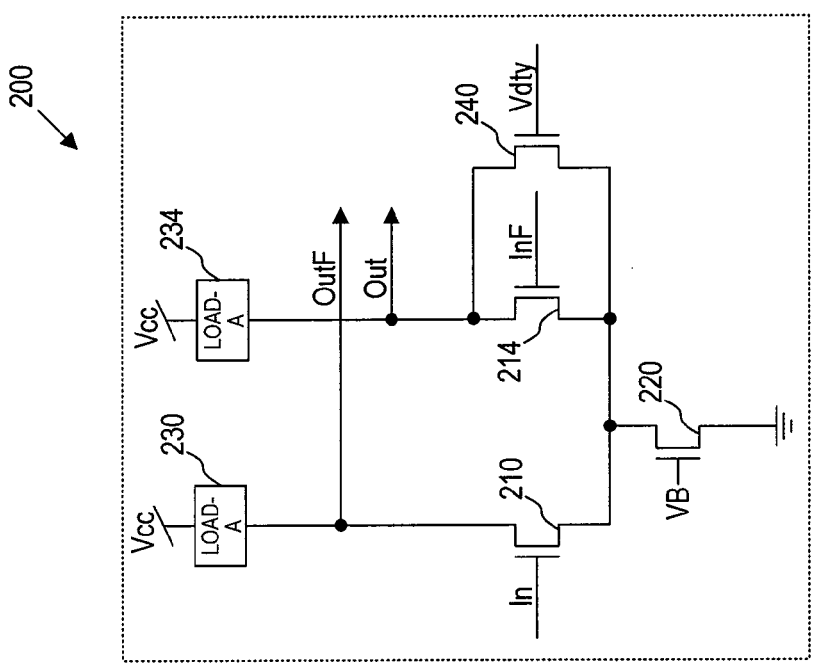
FIG. 4 is a schematic diagram of one embodiment of a differential amplifier.

The DCC adjusting differential amplifiers 110, 170 used in the clock generator circuit embodiments of FIGS. 2 and 3, respectively, may adjust the duty cycle using a variety of techniques. However, in one embodiment, the differential amplifiers 110, 170 may adjust the duty cycle of the received clock signal by adjusting the switch points of circuits used in the differential amplifier. One embodiment of a DCC adjusting differential amplifier 200 is shown in FIG. 4. The differential amplifier 200 may include a pair of differential NMOS input transistors 210, 214 having respective gates coupled to receive complementary input signals In, InF, respectively. The sources of the transistors 210, 214 may be coupled to a current source, such as an NMOS current sink transistor 220 that receives a bias voltage $V_B$ to control the total current flow through the transistors 210, 214. The drains of the transistors 210, 214 may be coupled to a supply voltage $V_{CC}$ through respective loads 230, 234. Complementary output signals Out, OutF are provided at a node between the transistor 210 and the load 230 and at a node between the transistor 214 and the load 234, respectively.

Figure 5:
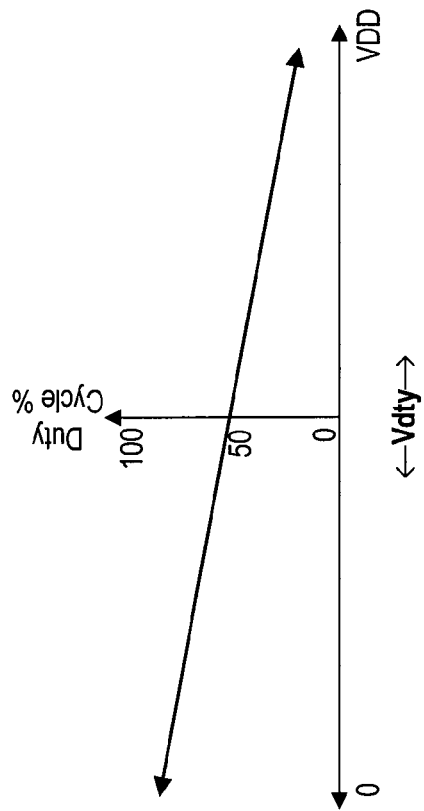
FIG. 5 is a graph showing the duty cycle of the differential amplifier of FIG. 4 as a function of control voltage.

As explained so far, the differential amplifier 200 would toggle responsive to the In and InF signals, and if the electrical characteristics of the transistors 210, 214 were identical, the duty cycle of each of the output signals would be a constant 50%. However, an NMOS duty cycle adjusting transistor 240 may be coupled in parallel with the input transistor 214 to adjust the duty cycle of the output signals Out, OutF above and below 50% as shown in FIG. 5. The transistor 240 receives a duty cycle adjustment voltage Vdty to adjust the duty cycle of the output signals Out and OutF. In one embodiment, the effective width-to-length ratio of the combined transistors 214, 240 may be substantially equal to the width-to-length ratio of the transistor 210 when the magnitude of the adjustment voltage Vdty is one-half the supply voltage $V_{CC}$. As further shown in FIG. 5, an increase in the voltage Vdty may increase the effective width-to-length ratio of the combined transistors 214, 240 so that the switch points used to generate the OutF signal are at a lower level of InF, thereby adjusting the duty cycle. Conversely, a decrease in the voltage Vdty may decrease the effective width-to-length ratio of the combined transistors 214, 240 so that the switch points used to generate the OutF signal are at a higher level of InF.

Figure 7:
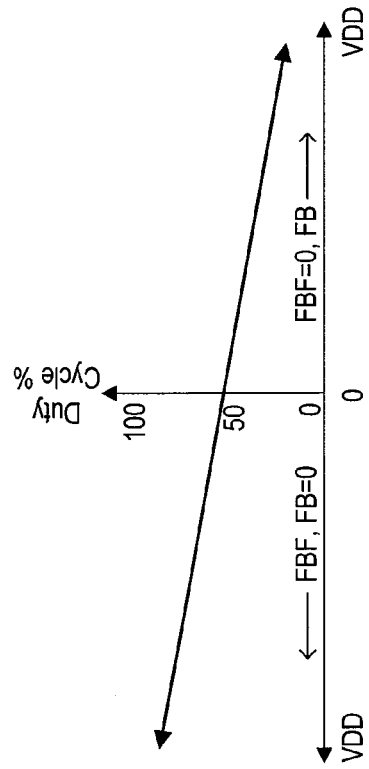
FIG. 7 is a graph showing the duty cycle of the differential amplifier of FIG. 6 as a function of both control voltages.
Figure 6:
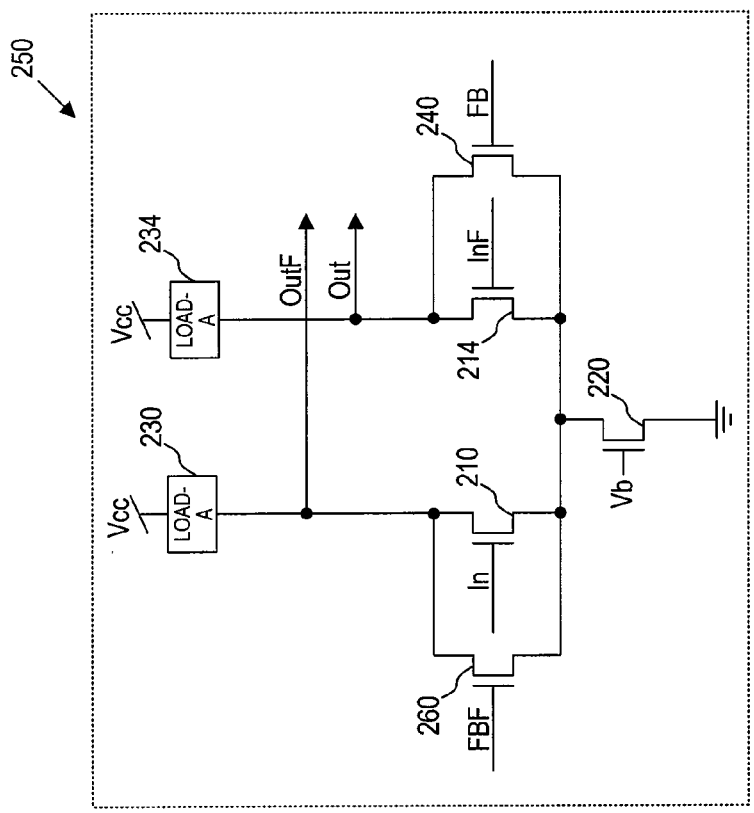
FIG. 6 is a schematic diagram of another embodiment of a differential amplifier.

Another embodiment of a DCC adjusting differential amplifier 250 is shown in FIG. 6. The amplifier 250 may include many of the same components that are in the amplifier 200 of FIG. 4, so that the same reference numerals will be used for those components, and a detailed explanation of these common components will not be repeated. The amplifier 250 differs from the amplifier 200 shown in FIG. 4 by including a NMOS duty cycle adjusting transistor 260 in parallel with the input transistor 210. As a result, the effective width-to-length ratio of the combined transistors 210, 260 may also be adjusted. The gate of the transistor 260 receives a first duty cycle adjustment voltage FBF, and the gate of the transistor 240 receives a second duty cycle adjustment voltage FB, which may be the complement of the voltage FBF. By differentially varying the adjustment voltage FB and FBF, the duty cycle of the output signals Out and OutF may be adjusted from a value, such as 50%, in either direction as shown in FIG. 7.

Figure 8:
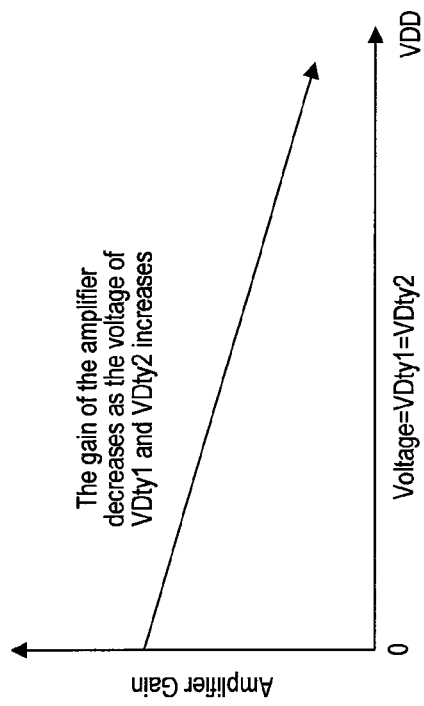
FIG. 8 is a graph showing the gain of the differential amplifier of FIG. 6 as a function of both control voltages.

The differential amplifier 250 may not only be capable of adjusting the duty cycle of a signal, but it may also be capable of providing a variable gain. Specifically, if the magnitude of the adjustment voltages FB and FBF are varied together rather than differentially, the gain of the amplifier 250 may also be adjusted. More specifically, as shown in FIG. 8, the gain of the amplifier 250 varies in linear inverse proportion to the magnitude of the adjustment voltages FB and FBF.

Figure 9:
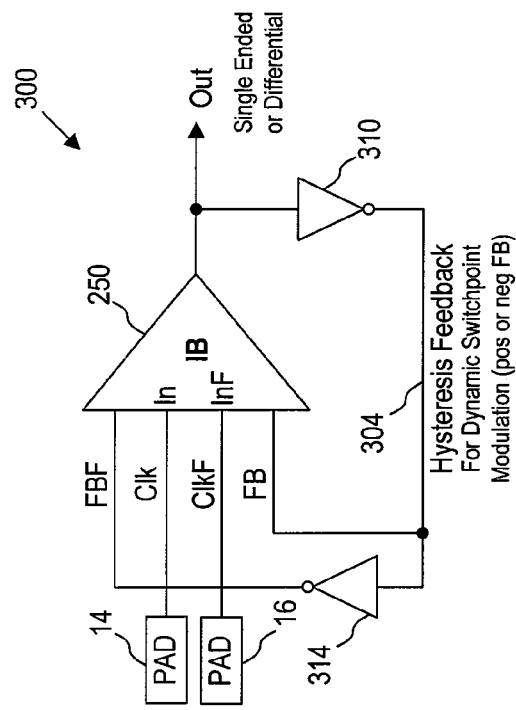
FIG. 9 is a logic diagram showing an embodiment of an input buffer having hysteresis functionality.

The differential amplifier 250 shown in FIG. 6 using only a single output Out may also be used to implement an input buffer with hysteresis functionality. As shown in FIG. 9, an input buffer 300 may include a differential amplifier 250 (FIG. 6) in which the input nodes In, InF (FIG. 6) receive respective complementary Clk and ClkF signals from the input nodes 14, 16. The input buffer 300 may also include a feedback circuit 304 that provides complementary feedback signals FB and FBF to the inputs of the amplifier 250 to which the control signals FB and FBF were applied in the embodiment of FIG. 6. The feedback circuit 304 may include an inverter 310 through which an output signal Out from the amplifier 250 may be coupled to provide the feedback signal FB, and it may include an additional inverter 314 through which the feedback signal FB may be coupled to provide the feedback signal FBF. Insofar as the Out signal may be in phase with the Clk signal and out of phase with the ClkF signal, the feedback signal FBF may be substantially in phase with the output signal Out, and the feedback signal FB may be substantially out of phase with the output signal Out.

The ClK signal may be applied to the gate of the transistor 210 (FIG. 6), the FBF signal may be applied to the gate of the transistor 260, the ClkF signal may be applied to the gate of the transistor 214, and the FB signal may be applied to the gate of the transistor 240. In this configuration, the input to which the FB signal is applied is functionally in parallel with the ClkF signal, and the input to which the FBF signal is applied is functionally in parallel with the Clk signal. Insofar as FBF transitions high responsive to Clk transitioning high, and FB transitions low responsive to ClkF transitioning low, the FB and FBF signals may provide positive feedback to the input buffer 300.

In operation, the feedback signals FB, FBF may adjust (e.g., alter) the switch points of the differential amplifier 250 so that, which switching in each direction responsive to corresponding changes in the Clk and ClkF signals, the Clk and ClkF signals would have to change back beyond the switch point to switch the differential amplifier 250 back to its earlier state. For example, when the Clk signal transitions high beyond $V_{CC}/2$ and the ClkF signal transitions low beyond $V_{CC}/2$, the output signal Out from the differential amplifier 250 may transition high, thereby transitioning the FB signal low and the FBF signal high. The high FBF signal increases the current flowing through the load 230 so that a Clk signal of less than VCC/2 would then be required to cause the transistor 210 to switch state. Similarly, the low FB signal decreases the current flowing through the load 234 so that a ClkF signal of greater than VCC/2 would then be required to transition the output signal Out low. Thus, the high feedback signal FBF has the effect of decreasing the low switch point of the transistor 210 below $V_{CC}/2$, and the low FB signal has the effect of increasing the high switch point of the transistor 214 above $V_{CC}/2$. As a result, the Clk signal would have to transition low beyond $V_{CC}/2$ and the ClkF signal would have to transitions high beyond $V_{CC}/2$ for the output signal Out to be switched back to a low level. The input buffer 300 responds in a similar manner for transitions of the Clk signal transitions low and transitions of the ClkF signal high.

Although the embodiment of the differential amplifier 250 used in the input buffer 300 has a single output Out, other embodiments of a differential amplifier used in an input buffer having hysteresis may provide two output signals Out and OutF as shown in FIG. 6. In such case, topologies other than that shown in FIG. 9 may be used. For example, it may be possible to eliminate one or both of the inverters 310, 314 by coupling the output signal Out directly to the gate of the transistor 260 and coupling the output signal OutF directly to the gate of the transistor 240.

Figures 10, 11:
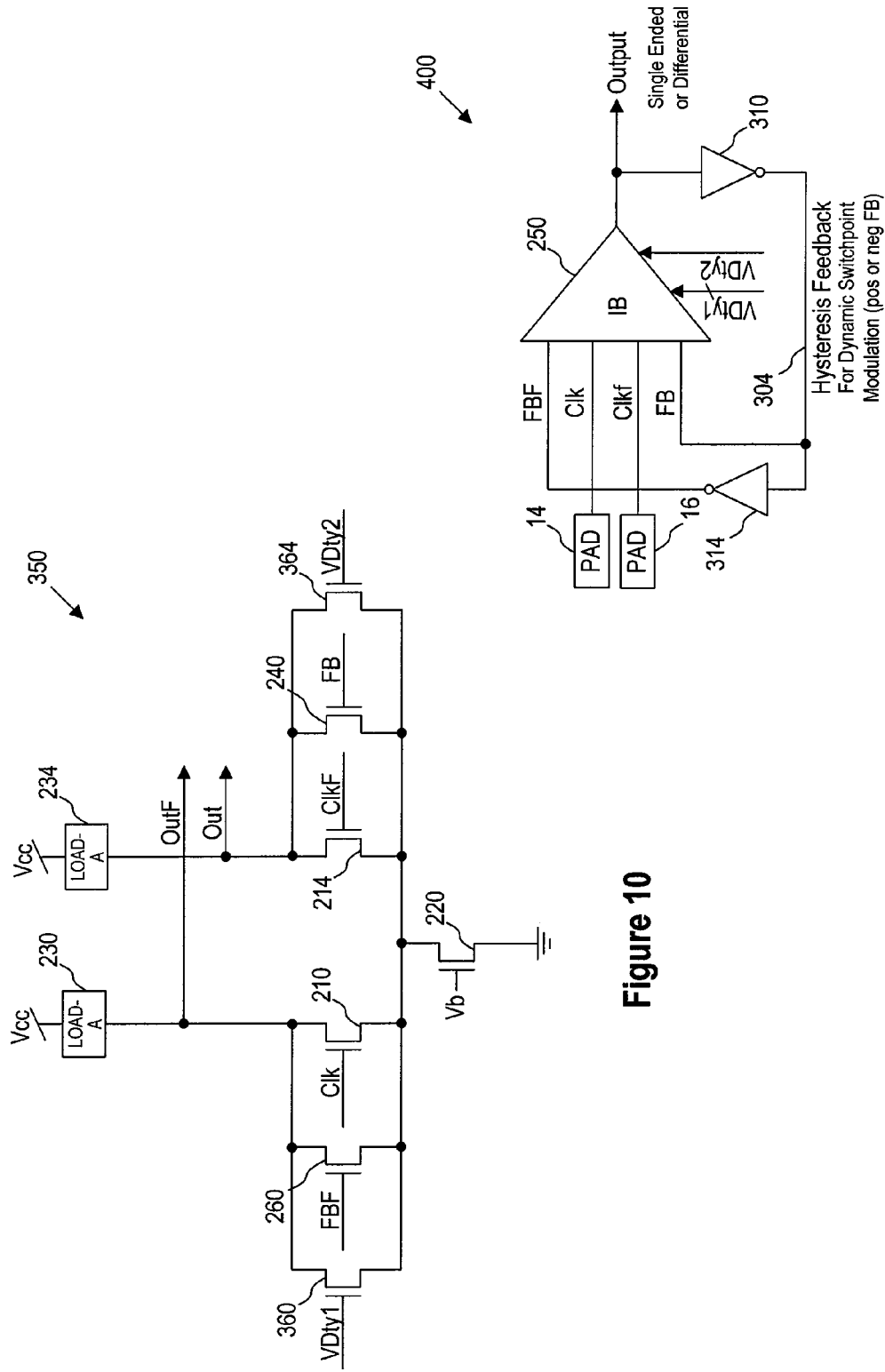
FIG. 10 is a schematic diagram of another embodiment of a differential amplifier that may have an adjustable duty cycle and gain as well as hysteresis functionality.
FIG. 11 is a logic diagram showing an embodiment of an input buffer using the differential amplifier of FIG. 10.

Another embodiment of a differential amplifier 350 is shown in FIG. 10. The differential amplifier may be identical to the differential amplifier 250 shown in FIG. 6 except that it may include an additional NMOS transistor 360 in parallel with the transistors 260, 210, and an additional NMOS transistor 364 in parallel with the transistors 214, 240. The gate of the transistor 360 may receive a control signal VDty1, and the gate of the transistor 364 may receive a control signal VDty2. The control signals VDty1, VDty2 may be adjusted (e.g., altered) to adjust the gain of the differential amplifier 350.

With additional reference to FIG. 11, The differential amplifier 350 may be used to implement an input buffer 400 as shown therein by coupling the output signal Out through the inverter 310 to generate the FB signal, which is applied to the gate of the transistor 240, and by coupling the feedback signal FB through the inverter 314 to generate the FBF signal, which is applied to the gate of the transistor 260. As a result, the duty cycle and gain of the input buffer 400 may be adjusted as explained above, and the input buffer 400 may have a hysteresis function.

As with the differential amplifier 250 used in the embodiment of the input buffer 300, the embodiment of the differential amplifier 350 used in the input buffer 400 has a single output Out. However, other embodiments of a differential amplifier used in an input buffer having hysteresis and an adjustable duty cycle and gain may provide two output signals Out and OutF as shown in FIG. 6.

Although the present invention has been described with reference to the disclosed embodiments, persons skilled in the art will recognize that changes may be made in form and detail without departing from the invention. Such modifications are well within the skill of those ordinarily skilled in the art. Accordingly, the invention is not limited except as by the appended claims.

I claim:

1. An input buffer, comprising:
   a differential amplifier having first and second input nodes and an output node, the differential amplifier being configured to generate an output signal at the output node that is substantially in phase with an input signal applied to the first input node and substantially out of phase with an input signal applied to the second input node, the differential amplifier further having third and fourth input nodes, the third input node being functionally in parallel with the first input node, and the fourth input node being functionally in parallel with the second input node, the differential amplifier further having fifth and sixth input nodes, the fifth input node being functionally in parallel with the first input node, and the sixth input node being functionally in parallel with the second input node; and
   a feedback circuit coupled to the output node and the first and second input nodes, the feedback circuit being configured to apply a first feedback signal to the third input node that is substantially in phase with the output signal and to apply a second feedback signal to the fourth input node that is substantially out of phase with the output signal, wherein the feedback circuit includes a first inverter and a second inverter, the first inverter having an input coupled to the output node of the differential amplifier and having an output coupled to the second input node, the second inverter having an input coupled to the output of the first inverter and having an output coupled to the fourth input node.

2. The input buffer of claim 1 wherein the differential amplifier comprises:
- a first transistor having a source, a drain and a gate, the gate of the first transistor coupled to the first input node;
- a second transistor having a source, a drain and a gate, the gate of the second transistor coupled to the second input node;
- a third transistor having a source coupled to the source of the first transistor, a drain coupled to the drain of the first transistor, and a gate coupled to the third input node; and
- a fourth transistor having a source coupled to the source of the second transistor, a drain coupled to the drain of the second transistor, and a gate coupled to the fourth input node.

3. A clock generator, comprising:
- an input buffer having a signal input node, a signal output node and a control input node, the input buffer being configured to be responsive to a duty cycle control signal applied to the control input node to adjust a duty cycle of a signal coupled from the signal input node to the signal output node, the input buffer comprising:
  - a differential amplifier having first and second input nodes and an output node, the differential amplifier being configured to generate an output signal at the output node that is substantially in phase with an input signal applied to the first input node and substantially out of phase with an input signal applied to the second input node, the differential amplifier further having third and fourth input nodes, the third input node being functionally in parallel with the first input node, and the fourth input node being functionally in parallel with the second input node; and
  - a feedback circuit coupled to the output node and the first and second input nodes, the feedback circuit being configured to apply a first feedback signal to the third input node that is substantially in phase with the output signal and to apply a second feedback signal to the fourth input node that is substantially out of phase with the output signal, wherein the feedback circuit includes a first inverter and a second inverter, the first inverter having an input coupled to the output node of the differential amplifier and having an output coupled to the second input node, the second inverter having an input coupled to the output of the first inverter and having an output coupled to the fourth input node;
- a delay line having an input node coupled to the output node of the input buffer, an output node, and a delay control node; the delay line being configured to be responsive to a delay control signal applied to the delay control node to adjust a delay of the delay line;
- a phase detector having a first input node coupled to the output node of the delay line, a second input node coupled to receive a signal applied to the signal input node of the input buffer, and an output node coupled to the delay control node, the phase detector being configured to provide the delay control signal at the output node corresponding to a phase difference between a signal applied to the first input node and a signal applied to the second input node; and
- a duty cycle control circuit having an input node coupled to the output node of the delay line and an output node coupled to the control input node of the input buffer, the duty cycle control circuit being configured to provide the duty cycle control signal at the output node corresponding to the duty cycle of a signal applied to the input node of the duty cycle control circuit.

4. The clock generator of claim 3 wherein the input buffer is further configured to receive a gain control signal and is configured to have a gain that is adjustable responsive to the gain control signal.

5. The clock generator of claim 3, further comprising a model delay circuit coupled between the output node of the delay line and the input node of the duty cycle control circuit.

6. The clock generator of claim 5, wherein the model delay is further coupled between the first input node of the phase detector and the output node of the delay line.

7. The clock generator of claim 3 wherein the signal input node of the input buffer comprises a first signal input node, and the signal output node of the input buffer comprises a first signal output node, and wherein the input buffer further comprises a second signal input node and a second signal output node, and wherein the input buffer is further configured to be responsive to the duty cycle control signal applied to the control input node to adjust a duty cycle of a signal coupled from the second signal input node to the second signal output node.

8. The clock generator of claim 7 wherein the input buffer is configured to be responsive to the duty cycle control signal applied to the control input node to adjust a duty cycle of a signal coupled from the first signal input node to the first signal output node in inverse proportion to the adjustment of the duty cycle of a signal coupled from the second signal input node to the second signal output node.

9. The clock generator of claim 3 wherein the duty cycle control circuit is configured to provide a duty cycle control signal to the control input node of the input buffer that causes the input buffer to adjust the duty cycle of the signal coupled from the signal input node to the signal output node so that the signal coupled to the output node has a duty cycle of substantially 50%.

* * * * *